(12) United States Patent
Bao et al.

(10) Patent No.: US 10,174,180 B2
(45) Date of Patent: Jan. 8, 2019

(54) POLYMER COMPOSITION, AN ARTICLE THEREOF AND A PROCESS FOR PREPARING THE SAME

(71) Applicant: DSM IP ASSETS B.V., Heerlen (NL)

(72) Inventors: Ren Bao, Echt (NL); Robert Hendrik Catharina Janssen, Echt (NL)

(73) Assignee: DSM IP ASSET B.V., Heerlen (NL)

( * ) Notice: Subject to any disclaimer, the term of this patent is extended or adjusted under 35 U.S.C. 154(b) by 282 days.

(21) Appl. No.: 15/126,361

(22) PCT Filed: Mar. 23, 2015

(86) PCT No.: PCT/EP2015/056105
§ 371 (c)(1),
(2) Date: Sep. 15, 2016

(87) PCT Pub. No.: WO2015/144630
PCT Pub. Date: Oct. 1, 2015

(65) Prior Publication Data
US 2017/0107348 A1 Apr. 20, 2017

(30) Foreign Application Priority Data

Mar. 25, 2014 (CN) .......................... 2014 1 0113688
Apr. 8, 2014 (EP) ..................................... 14163844

(51) Int. Cl.
| | | |
|---|---|---|
| *C08K 3/22* | (2006.01) | |
| *C08K 7/14* | (2006.01) | |
| *B29B 7/90* | (2006.01) | |
| *B29B 9/06* | (2006.01) | |
| *B29C 45/00* | (2006.01) | |
| *C23C 18/20* | (2006.01) | |
| *C23C 18/38* | (2006.01) | |
| *C23C 18/16* | (2006.01) | |
| *B29B 7/48* | (2006.01) | |
| *H05K 1/03* | (2006.01) | |
| *H05K 1/09* | (2006.01) | |
| *H05K 3/10* | (2006.01) | |
| *B29K 105/12* | (2006.01) | |
| *B29K 309/08* | (2006.01) | |
| *B29K 101/12* | (2006.01) | |

(52) U.S. Cl.
CPC .................. *C08K 3/22* (2013.01); *B29B 7/48* (2013.01); *B29B 7/90* (2013.01); *B29B 9/06* (2013.01); *B29C 45/0001* (2013.01); *B29C 45/0005* (2013.01); *C08K 7/14* (2013.01); *C23C 18/1641* (2013.01); *C23C 18/1689* (2013.01); *C23C 18/204* (2013.01); *C23C 18/38* (2013.01); *H05K 1/032* (2013.01); *H05K 1/09* (2013.01); *H05K 3/10* (2013.01); *B29K 2101/12* (2013.01); *B29K 2105/12* (2013.01); *B29K 2309/08* (2013.01); *C08K 2003/2265* (2013.01); *C08K 2201/001* (2013.01)

(58) Field of Classification Search
CPC ......................................................... C08K 3/22
See application file for complete search history.

(56) References Cited

U.S. PATENT DOCUMENTS

| | | | | |
|---|---|---|---|---|
| 6,037,046 A | * | 3/2000 | Joshi .......................... | E04B 1/92 174/386 |
| 2012/0160828 A1 | * | 6/2012 | Bowman ............. | B29C 65/3612 219/603 |
| 2014/0066560 A1 | | 3/2014 | Stoppelmann et al. | |

FOREIGN PATENT DOCUMENTS

| | | |
|---|---|---|
| EP | 2 711 399 | 3/2014 |
| WO | WO 2014/042284 | 3/2014 |

OTHER PUBLICATIONS

International Search Report for PCT/EP2015/056105, dated Sep. 1, 2015, 4 pages.
Buckley et al., "Inductively heated shape memory polymer for the magnetic actuation of medical devices", IEEE Transactions on Biomedical Engineering, vol. 53, No. 10, Oct. 1, 2006, pp. 2075-2083.
Fawzi et al., "Structural, Dielectric properties and AC conductivity of Ni (1-x) Znx Fe2O4 spinel ferrites", Journal of Alloys and Compounds, vol. 502, May 8, 2010, pp. 231-237.

* cited by examiner

*Primary Examiner* — Wenwen Cai
(74) *Attorney, Agent, or Firm* — Nixon & Vanderhye P.C.

(57) ABSTRACT

Present application discloses a thermoplastic composition comprising a) 42.5 wt. % to 94 wt. % of thermoplastic matrix resin; b) 1 wt. % to 7.5 wt. % of a laser direct structuring additive; and c) 5 wt. % to 50 wt. % fibrous reinforcement agent; wherein the wt. % is relative to the total weight of the composition; wherein the laser direct structuring additive is represented by formula $Zn_xNi_{(1-x)}Fe_2O_4$, wherein the x is higher than 0.60 and lower than 0.85; wherein the composition is capable of being plated after being activated using a laser.

20 Claims, No Drawings

POLYMER COMPOSITION, AN ARTICLE THEREOF AND A PROCESS FOR PREPARING THE SAME

This application is the U.S. national phase of International Application No. PCT/EP2015/056105 filed 23 Mar. 2015, which designated the U.S. and claims priority to CN Patent Application No. 201410113688.4 filed 25 Mar. 2014, and EP Patent Application No. 14163844.5 filed 8 Apr. 2014, the entire contents of each of which are hereby incorporated by reference.

FIELD

The present application concerns a thermoplastic polymer composition comprising a Laser Direct Structuring (LDS) additive. In particular, the present invention concerns an article prepared by a LDS process and a process for preparing the same.

BACKGROUND

Laser Direct Structuring (LDS) is a process that enables an injection molded article to be selectively plated with metal to form discrete conductive circuit paths. First, a plastic article is injection molded using a polymer compound formulated specifically for this process. The article is then activated with a laser in the desired pattern, thereby activating the surface of the article in the areas traced with the laser. The article then undergoes an electroless plating process with a metal such as copper, nickel or gold; with the resultant circuit paths conforming exactly to the laser pattern.

The advantage of the Laser Direct Structuring (LDS) process is the ability to have a circuit path following the contour of the injection molded article, thus applying a true 3D circuit path. By integrating the circuit directly onto the plastic article, the designer now has freedoms previously unavailable. These design freedoms allow article consolidation, weight reduction, miniaturization, reduced assembly time, improved reliability and overall system cost reduction.

Key markets and applications for the Laser Direct Structuring process include medical, automotive, aerospace, military, RF antennas, sensors, security housings and connectors.

US20090292051 (SABIC) discloses a high dielectric constant thermoplastic composition that is capable of being used in a laser direct structuring process. The composition includes a thermoplastic base resin, a laser direct structuring additive, and at least one kind of ceramic filler. The thermoplastic composition comprises:
a) from 10-90% by weight of a thermoplastic base resin;
b) from 0.1-30% by weight of a laser direct structuring additive; and
c) 10-80% or less by weight of at least one ceramic filler;
 wherein the thermoplastic compositions are capable of being plated after being activated using a laser.

The composition provides a high dielectric constant, low loss tangent thermoplastic composition. Copper chromium oxide spinel is used as the direct structuring additive.

US2012/0279764 (SABIC) discloses a thermoplastic composition that is capable of being used in a laser direct structuring process to provide enhanced plating performance and good mechanical properties. The compositions of that invention include a thermoplastic base resin, a laser direct structuring additive and a white pigment.

The thermoplastic composition comprises:
a) from 65-92% by weight of a thermoplastic base resin;
b) from 0.5-20% by weight of a laser direct structuring additive; and
c) from 0.5-15% by weight of at least one pigment selected from $TiO_2$ including anatise, rutile, coated and uncoated, ZnO, $BaSO_4$, $CaCO_3$, $BaTiO_3$ or a combination including at least one of the foregoing pigments;
 wherein the thermoplastic compositions are capable of being plated after being activated using a laser;
 the laser direct structuring additive is a heavy metal mixture oxide spinel, such as copper chromium oxide spine; a copper salt, such as copper hydroxide, copper phosphate, copper sulfate, cuprous thiocyanate; or a combination including at least one of the foregoing laser direct structuring additives.

US 20040241422 (LPKF) discloses a method to produce conductive tracks disposed on an electrically non-conductive support material by depositing a metallized layer on metal nuclei produced by using electromagnetic radiation to break up electrically non-conductive metal compounds dispersed in the support material, and a method for producing them. The electrically non-conductive metal compounds are insoluble spinel-based inorganic oxides which are thermally stable and are stable in acidic or alkaline metallization baths, and which are higher oxides which are thermally stable and are stable in acidic or alkaline metallization baths, and which are higher oxides with a spinel structure, and which remain unchanged in non-irradiated areas. The spinel based inorganic oxides used are heat resistant and remain stable after being subjected to soldering temperatures. The conductor tracks are reliably and easily produced and adhere strongly to the support.

US20080015320 (DU-PONT) discloses a light-activatable polymer composition including a polymer binder being present in an amount from 40, 45, 50, 55, 60, 65, 70, 75, 80, 85, 90, 95, 96 or 97 weight percent of the total weight of the polymer composition; a spinel crystal filler present in an amount from 3, 4, 5, 6, 7, 8, 9, 10, 11, 12, 13, 14, 15, 20, 25, 30, 35, 40, 45, 50, 55 and 60 weight-percent of the total weight of the polymer composition, and methods for making same. In the examples of this application, $CuCr_2O_4$ is used as spinel.

In the prior art, based on LPKF technology, $CuCr_2O_4$ spinel is used as a laser direct structuring additive to enable the matrix resin to be used in a laser direct structuring process. One disadvantage of using $CuCr_2O_4$ spinel as a LDS additive is that $CuCr_2O_4$ spinel is detrimental to the mechanical properties of the matrix polymer. Thus the application of the resulting polymer will be limited. On the other hand it has been observed that a spinel such as $NiFe_2O_4$ cannot be plated at all and is bad in mechanical properties as well. In the present application, $CuCr_2O_4$ is replaced by another additive Ni—Zn ferrite ($NiFe_2O_4$ doped with $ZnFe_2O_4$) to obtain a thermoplastic polymer composition which is capable of being plated after being activated using a laser. Compared to the composition using $CuCr_2O_4$ spinel as a LDS additive, the mechanical property of the resulting composition of present application is improved.

SUMMARY OF THE INVENTION

The present application provides a thermoplastic polymer composition comprising:
a) 42.5 wt. % to 94 wt. % of thermoplastic matrix resin;
b) 1 wt. % to 7.5 wt. % of a laser direct structuring additive; and
c) 5 wt. % to 50 wt. % of fibrous reinforcement agent;
 wherein the wt. % is relative to the total weight of the composition;

wherein the laser direct structuring additive is represented by formula $Zn_xNi_{(1-x)}Fe_2O_4$, wherein the x is higher than 0.60 and lower than 0.85; wherein the compositions is capable of being plated after being activated by a laser.

DETAILS OF THE INVENTION

The thermoplastic matrix resin may be one or more selected from the group consisting of polyesters, polyamides, polyphenylene sulphides, polyphenylene oxides, polysulfones, polyarylates, polyetheretherketones, polyetherimides and mixtures and/or copolymers thereof.

Preferably, the thermoplastic matrix resin comprises a polyamide. Representative examples include but are not limited to homopolyamides like polyamide 6, polyamide 66, polyamide 56, polyamide 46, polyamide 4T, polyamide 5T, polyamide 6T, polyamide 6I, polyamide 7T, polyamide 8T, polyamide 9T, polyamide 10T, polyamide 11T, polyamide 12T, polyamide MXD6, and the copolyamides thereof; more preferably, the thermoplastic matrix resin is a polyamide with melting temperature higher than 265° C., such as polyamide 4T, polyamide 5T, polyamide 6T, polyamide 6I, polyamide 7T, polyamide 8T, polyamide 9T, polyamide 10T, polyamide 11T, polyamide 12T, polyamide MXD6, and the copolyamide thereof and/or the copolymers of one or more of polyamide 4T, polyamide 5T, polyamide 6T, polyamide 6I, polyamide 7T, polyamide 8T, polyamide 9T, polyamide 10T, polyamide 11T, polyamide 12T or polyamide MXD6 copolymerized with one or more selected from polyamide 6, polyamide 66, polyamide 56 and polyamide 46; such as polyamide 6/6T, polyamide 6I/6T, polyamide 6/10T, polyamide 66/6T, polyamide 46/4T, polyamide 10T/6T, polyamide 6T/5T, polyamide 6T/10T, polyamide 66/4T/46 [which is a copolyamide of polyamide 66, polyamide 4T and polyamide 46], polyamide 6T/4T/46 [which is a copolyamide of polyamide 6T, polyamide 4T and polyamide 46], polyamide 6T/66/46 [copolyamide of polyamide 6T, polyamide 66 and polyamide 46], polyamide 6T/5T/56 [copolyamide of polyamide 6T, polyamide 5T and polyamide 56] and polyamide 6T/66/56 [copolyamide of polyamide 6T, polyamide 66 and polyamide 56]; most preferably, the thermoplastic matrix resin is polyamide 66/4T/46, polyamide 6T/4T/46, polyamide 6T/66/46, polyamide 6T/5T/56 and polyamide 6T/66/56; even more preferably, the thermoplastic matrix resin is polyamide 66/4T/46 such as Stanyl ForTii™ DS100.

The amount of the thermoplastic matrix resin present in the composition of the present invention is based on the selected properties of the compositions as well as the molded articles made from these composition. The factors include the type and/or amount of the LDS additive used.

Preferably, the thermoplastic matrix resin is present in an amount of from 42.5 wt. % to 94 wt. %, more preferably, from 50 wt. % to 80 wt. %, most preferably from 65 wt. % to 75 wt. %.

The thermoplastic matrix resin may be reinforced by adding fibrous reinforcement agent. Any suitable fibrous reinforcement agent may be used in present invention, such as glass fiber, carbon fiber, basalt fiber or aramid fiber. The fibrous reinforcement agent is present in range of 5 wt. % to 50 wt. %; preferably 15 wt. % to 35 wt. %, more preferably 20 wt. % to 30 wt. %; most preferably around 30 wt. %.

In addition to the thermoplastic matrix resin, the composition of present invention also includes a Laser Direct Structuring (LDS) additive. The LDS additive is selected to enable the composition to be used in a LDS process. In the LDS process, a laser beam exposes the LDS additive to place it at the surface of the composition and to activate metal atoms from the LDS additive. As such, the LDS additive is selected such that, upon being exposed to a laser beam, metal atoms are activated and in areas not exposed to the laser beam, no metal atoms are exposed. In addition, the LDS additive is selected such that, after being exposed to laser beam, the etching area is capable of being plated to form conductive path by followed a standard electroless plating process such as a copper plating process. Other electroless plating processes that may be used include, but not limited to, gold plating, nickel plating, silver plating, zinc plating, tin plating or the like.

The goal of using LDS additive is to form metal seeds on the laser etched surface and the final metallization layer during the following plating process.

The Laser Direct Structuring additive being present is denoted as $Zn_xNi_{(1-x)}Fe_2O_4$, wherein the x is higher than 0.60 and lower than 0.85. $Zn_xNi_{(1-x)}Fe_2O_4$ is a kind of nickel-zinc ferrite with a spinel structure. It is not a simple mixture of $ZnFe_2O_4$ and $NiFe_2O_4$. It is also described as $NiFe_2O_4$ doped with $ZnFe_2O_4$ in some documents. In the context of this application, $Zn_xNi_{(1-x)}Fe_2O_4$ can also be denoted by the molar ratio of Zn and Ni in the Nickel-zinc ferrite. For example $Zn_{0.75}Ni_{0.25}Fe_2O_4$ can be denoted by 75Zn/25Ni. $Zn Fe_2O_4$ can be denoted by 100Zn and $Ni Fe_2O_4$ can be denoted by 100 Ni.

Preferably, the value of X is higher than 0.65 and lower than 0.80; more preferably, higher than 0.70 and lower than 0.75; most preferably, the value of X is 0.75 and the laser structuring additive is $Zn_{0.75}Ni_{0.25}Fe_2O_4$.

The amount of the LDS additive included is sufficient to enable to plate the conductive path formed after activation by the laser while not adversely affecting mechanical properties. In one example, the LDS additive is present in amount of from 1 wt. % to 7.5 wt. %, preferably 2.5 wt. % to 6 wt. %; more preferably 3 wt. % to 5 wt. %, most preferably 5 wt. %. Generally, the more laser direct structuring additive is present, the higher is the plating quality that is obtained. When the amount of laser structuring additive is more than 7.5 wt. %, the mechanical performance of the material will be detrimental.

The particle size distribution of the laser structuring additive suitably ranges from 50 nanometers to 50 micrometer, preferably, ranges from 100 nanometers to 10 micrometer, more preferably, from 0.5 micrometer to 3 micrometer.

Preferably, the thermoplastic composition further comprises, d) 0 to 30 wt. % of flame retardants;
e) 0 to 20 wt. % of other additives;

wherein the wt. % is relative to the total weight of the composition.

Any flame retardant well known to the skilled in the art can be used in present invention. Preferably, the flame retardant includes, but not limited to, one or more selected from metal hydroxides such as aluminium hydroxide and magnesium hydroxide, nitrogen based flame retardants such as melamine and melamine derivatives, phosphorus based flame retardants such as organic and inorganic phosphates, phosphonates, phosphinates e.g. metal phosphinate, and red phosphorus; preferably phosphorus based flame retardant, the blends of nitrogen based flame retardants and phosphorus based flame; more preferably, metal phosphinates.

The flame retardant may be modified by any method well known to the skilled in the art before it is added into the compositions.

The flame retardant of component d) is suitably present in a range from 0 wt. % to 30 wt. %, preferably, from 10 wt. % to 30 wt. %.

The additive of component e) may be any auxiliaries well known by one skilled in the art such as pigment, antioxidants, light stabilizers, heat stabilizers; antistatic agents, UV absorbers, mold releasing agent, lubricants, blowing agents or other fillers suitable to improve other properties may be added to the composition.

The additives of component e) is suitably present in a range from 0 wt. % to 20 wt. %, preferably from 0.5 wt. % to 5 wt. %.

In addition, the present application also provides an article of manufacture comprising:
  a molded article having a an activated pattern thereon;
  a copper layer plated on the activated pattern, thereby forming a conductive path;
  wherein the molded article is formed from a thermoplastic composition comprising:
  a) 42.5 wt. % to 94 wt. % of thermoplastic matrix resin;
  b) 1 wt. % to 7.5 wt. % of a laser direct structuring additive; and
  c) 5 wt. % to 50 wt. % fibrous reinforcement agent;
  wherein the wt. % is relative to the total weight of the composition;
  wherein the laser direct structuring additive is represented by formula $Zn_xNi_{(1-x)}Fe_2O_4$, wherein the x is higher than 0.60 and lower than 0.85; wherein the thermoplastic compositions is capable of being plated after being activated using a laser.

The articles disclosed in present application can be used in the field of medical, automotive, aerospace, military, RF antennas, sensors, security housings and connectors.

Further, the present application provides a method of forming an article comprising the steps of:
  molding an article from a thermoplastic composition;
  using a laser to form an activated pattern on the molded article; and
  plating a copper layer onto the activated pattern to form a conductive path;
  wherein the thermoplastic composition comprising:
  a) 42.5 wt. % to 94 wt. % of thermoplastic matrix resin;
  b) 1 wt. % to 7.5 wt. % of a laser direct structuring additive; and
  c) 5 wt. % to 50 wt. % fibrous reinforcement agent;
  wherein the wt. % is relative to the total weight of the composition;
  wherein the laser direct structuring additive is represented by formula $Zn_xNi_{(1-x)}Fe_2O_4$, wherein the x is higher than 0.60 and lower than 0.85; wherein the thermoplastic compositions is capable of being plated after being activated using a laser.

The thermoplastic composition of the present invention may be formed by using any known method of combining multiple components to form a resin. In one embodiment, the components are first blended in a high speed mixer, or other low shear processes. The blend is then fed into the throat of a twin-screw extruder via a hopper. The extruder is generally operated at a temperature higher than that necessary to cause the composition to flow.

When the thermoplastic resin is used as a matrix resin, the LDS additive is compounded with the thermoplastic resin and other additive and/or flame retardant in the extruder to obtain the aimed composition.

Shaped, formed, or molded articles including the composition are also provided. The thermoplastic composition can be molded into useful shaped articles by a variety of means such as injection molding, extrusion, rotational molding, blow molding and thermoforming to form articles such as for example, housing for computers, notebook and portable computers, etc., housing for cell phone and other such communications equipment; parts of medical applications, automotive applications and the like.

EXAMPLE

The present invention can be illustrated by following examples but not limited to thereto.
Material
Polyamide: Stanyl ForTii™ DS100 from DSM.
LDS additive:
Commercial product Shepherd Black 1G ($CuCr_2O_4$) from Shepherd Color Company
Commercial product series NeoF20FERPO [75Ni/25Zn];
  NeoF2FERPO [50Ni/50Zn];
  NeoMIX25Ni75Zn [25Ni/75Zn];
  NeoMIX100Zn [100Zn];
  NeoF100 [100Ni] from Neosid Pemetzrieder GmbH & Co
    Glass fiber: Standard short glass fibers—CIPC 3014B from PPG Industries Inc.
    Plating Bath Composition: ENPLATE® Chemical solution direct from Enthone GmbH Example 1

65 wt. % Stanyl ForTii™ DS100, 30 wt. % Glass fibers and 5 wt. % additives were compounded in a ZE25 twin-screw extruder from KrausMaffei Berstorff according to standard DSM Stanyl ForTii™ compounding conditions. After extrusion, the obtained compounding materials were cut into granules for injection molding. In an injection molding process, these granulates were formed into plaques of 80×80×2 mm dimensions. The injection molding plaques were then put in a Trumph Laser Mark Machine with the following parameter settings indicated in Table 1. Type of laser that we used is Nd:YAG lasers with a wavelength of 1064 nm.

Increasing the temperature of the plating bath to 48° C. and keeping the temperature at 48° C. After laser treatment, the laser treated plaques were completely immersed into the copper electroless plating bath for 30 min. Before and after plating, plaques were rinsed with deionized water.

The parameter settings of the laser machine used in Example 1 and the plating results—the thickness of the copper layer plated on the plaques is shown in table 1.

TABLE 1

| | Pulse Frequency(kHz)/Laser Power (% of 200 W) | | | | | | | | |
|---|---|---|---|---|---|---|---|---|---|
| LDS additive | 60/70 | 60/80 | 60/90 | 80/70 | 80/80 | 80/90 | 100/70 | 100/80 | 100/90 |
| 100Ni | 0 | 0 | 0 | 0 | 0 | 0 | 0 | 0 | 0 |
| 75Ni/25Zn | 0.1 | 0.5 | 0.9 | 0.1 | 0.4 | 0.7 | 0.1 | 0.3 | 0.5 |
| 50Ni/50Zn | 0.6 | 1.6 | 1.8 | 0.5 | 1.4 | 1.6 | 0.4 | 1 | 1.4 |
| 25Ni/75Zn | 0.8 | 3.1 | 3.6 | 0.9 | 2.2 | 3.5 | 0.9 | 2 | 3.3 |
| 100Zn | 0.4 | 1.5 | 1.5 | 0.4 | 1.2 | 1.5 | 0.4 | 0.8 | 1.4 |
| Black1G($CuCr_2O_4$) | 2.8 | 6.1 | 6.4 | 2.3 | 5.2 | 5.8 | 2 | 3.8 | 5.1 |

Conclusion

From Table 1, it can be seen that the composition according to the present invention comprising the 25Ni/75Zn LDS additive can be plated within 30 min and the resulting copper layer thickness is thicker than that of the composition comprising 100Ni, 75Ni/25Zn, 50Ni/50Zn and 100Zn although thinner than that of the composition comprising (CuCr$_2$O$_4$).

Example 2

Mechanical Properties

Granules containing 65 wt. % Stanyl ForTii™ DS100, 30 wt. % Glass fibers and 5 wt. % LDS additives were injection molded into standard bars for tensile test ISO 527 and Charpy tests ISO 179, and results are shown in Table 2.

TABLE 2

|  | E-Modulus Mpa | Tensile Strength Mpa | Elongation at break % | Charpy unnotch kJ/M2 | Charpy notch kJ/M2 |
|---|---|---|---|---|---|
| [100Zn] | 11138 | 126.5 | 1.26 | 30.78 | 3.75 |
| [25Ni/75Zn] | 11240 | 124.9 | 1.24 | 29.34 | 3.65 |
| [50Ni/50Zn] | 11393 | 106.2 | 1.04 | 29.11 | 3.33 |
| [75Ni/25Zn] | 11444 | 110.3 | 1.08 | 29.06 | 3.56 |
| [100Ni] | 11226 | 106.3 | 1.07 | 26.91 | 3.04 |
| Black1G(CuCr$_2$O$_4$) | 11220 | 110.6 | 1.08 | 26.32 | 3.41 |

Conclusion

According to the data indicated in Table 2, comparing to the composition comprising CuCr$_2$O$_4$ and the other composition comprising the Ni and/or Zn ferrites, the mechanical properties, i.e., elongation at break and strength, of the composition comprising 25Ni/75Zn was well improved.

The invention claimed is:

1. A thermoplastic composition comprising:
   a) 42.5 wt. % to 94 wt. %, relative to the total weight of the composition, of a thermoplastic matrix resin;
   b) 1 wt. % to 7.5 wt. %, relative to the total weight of the composition, of a laser direct structuring additive represented by formula Zn$_x$Ni$_{(1-x)}$Fe$_2$O$_4$, wherein x is higher than 0.60 and lower than 0.85; and
   c) 5 wt. % to 50 wt. %, relative to the total weight of the composition, of a fibrous reinforcement agent; wherein the composition is capable of being plated after being activated using a laser.

2. The thermoplastic composition according to claim 1, wherein x is 0.65-0.80.

3. The thermoplastic composition according to claim 2, wherein x is 0.70-0.75, and wherein the laser direct structuring additive is present in an amount from 2.5 wt. % to 6 wt. %.

4. The thermoplastic composition according claim 1, wherein the reinforcement agent is one or more selected from the group consisting of glass fibers, carbon fibers, basalt fibers and aramid fibers.

5. The thermoplastic composition according to claim 1, wherein the fibrous reinforcement agent is present in an amount from 10 wt. % to 50 wt. %.

6. The thermoplastic composition according to claim 1, wherein the thermoplastic resin is one or more selected from the group consisting of polyesters, polyamides, polyphenylene sulphides, polyphenylene oxides, polysulfones, polyarylates, polyetheretherketones, polyetherimides, mixtures thereof and copolymers thereof.

7. The thermoplastic composition according to claim 1, wherein the thermoplastic matrix resin comprises a polyamide.

8. The thermoplastic composition according to claim 1, which further comprises one or more flame retardant selected from the group consisting of metal hydroxides, nitrogen based flame retardants and phosphorus based flame retardants.

9. The thermoplastic composition according to claim 1, wherein the composition further comprises:
   d) from 0 to 30 wt. %, relative to the total weight of the composition, of a flame retardant; and/or
   e) from 0 to 20 wt. %, relative to the total weight of the composition, of at least one other additive.

10. The thermoplastic composition according to claim 9, wherein the flame retardant is one or more selected from the group consisting of metal hydroxides, nitrogen based flame retardants and phosphorus based flame retardants.

11. The thermoplastic composition according to claim 5, wherein the fibrous reinforcement agent is present in an amount from 15 wt. % to 35 wt. %.

12. The thermoplastic composition according to claim 5, wherein the fibrous reinforcement agent is present in an amount from 20 wt. % to 30 wt. %.

13. An article of manufacture comprising:
   a molded article having a laser activated pattern thereon; and
   a copper layer plated on the laser activated pattern, thereby forming a conductive path; wherein
   the molded article is formed from a thermoplastic composition comprising:
   a) 42.5 wt. % to 94 wt. %, relative to the total weight of the composition, of a thermoplastic matrix resin;
   b) 1 wt. % to 7.5 wt. %, relative to the total weight of the composition, of a laser direct structuring additive represented by formula Zn$_x$Ni$_{(1-x)}$Fe$_2$O$_4$, wherein x is higher than 0.60 and lower than 0.85; and
   c) 5 wt. % to 50 wt. %, relative to the total weight of the composition, of a fibrous reinforcement agent.

14. The article according to claim 13, wherein x is 0.70-0.75, and wherein the laser direct structuring additive is present in an amount from 2.5 wt. % to 6 wt. %.

15. The article according claim 13, wherein the reinforcement agent is one or more selected from the group consisting of glass fibers, carbon fibers, basalt fibers and aramid fibers.

16. The article according to claim 13, wherein the composition further comprises:
   d) from 0 to 30 wt. %, relative to the total weight of the composition, of a flame retardant; and/or
   e) from 0 to 20 wt. %, relative to the total weight of the composition, of at least one other additive.

17. The article according to claim 16, wherein the flame retardant is one or more selected from the group consisting of metal hydroxides, nitrogen based flame retardants and phosphorus based flame retardants.

18. A method of forming an article comprising the steps of:
   (i) molding an article from a thermoplastic composition;
   (ii) forming an activated pattern on the molded article with a laser; and
   (iii) plating a copper layer onto the activated pattern to form a conductive path; wherein
   the thermoplastic composition comprises:
   a) 42.5 wt. % to 94 wt. %, relative to the total weight of the composition, of a thermoplastic matrix resin;
   b) 1 wt. % to 7.5 wt. %, relative to the total weight of the composition, of a laser direct structuring additive represented by formula Zn$_x$Ni$_{(1-x)}$Fe$_2$O$_4$, wherein x is higher than 0.60 and lower than 0.85; and
   c) 5 wt. % to 50 wt. %, relative to the total weight of the composition, of a fibrous reinforcement agent.

19. The method according to claim 18, wherein the composition further comprises:
   d) from 0 to 30 wt. %, relative to the total weight of the composition, of a flame retardant; and/or
   e) from 0 to 20 wt. %, relative to the total weight of the composition, of at least one other additive.

20. The method according to claim 19, wherein the flame retardant is one or more selected from the group consisting of metal hydroxides, nitrogen based flame retardants and phosphorus based flame retardants.

\* \* \* \* \*